United States Patent
Welch et al.

(10) Patent No.: US 10,804,251 B2
(45) Date of Patent: Oct. 13, 2020

(54) LIGHT EMITTING DIODE (LED) DEVICES, COMPONENTS AND METHODS

(71) Applicant: Cree, Inc., Durham, NC (US)

(72) Inventors: Erin R. F. Welch, Ann Arbor, MI (US); Colin Kelly Blakely, Franklinton, NC (US); Jesse Colin Reiherzer, Raleigh, NC (US); Christopher P. Hussell, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 15/359,517

(22) Filed: Nov. 22, 2016

(65) Prior Publication Data

US 2018/0145059 A1     May 24, 2018

(51) Int. Cl.
| | |
|---|---|
| *H01L 25/075* | (2006.01) |
| *H05K 1/05* | (2006.01) |
| *H01L 33/46* | (2010.01) |
| *H01L 33/48* | (2010.01) |

(Continued)

(52) U.S. Cl.
CPC ...... *H01L 25/0756* (2013.01); *H01L 25/0753* (2013.01); *H01L 33/46* (2013.01); *H01L 33/483* (2013.01); *H01L 33/62* (2013.01); *H01L 33/641* (2013.01); *H05K 1/056* (2013.01); *H01L 2224/8592* (2013.01); *H01L 2933/0033* (2013.01); *H01L 2933/0066* (2013.01); *H05K 2201/0959* (2013.01);

(Continued)

(58) Field of Classification Search
CPC . H01L 25/0756; H01L 33/483; H01L 33/641; H01L 33/46; H01L 33/62; H01L 25/0753; H01L 2933/0066; H01L 2933/0033
See application file for complete search history.

(56) References Cited

U.S. PATENT DOCUMENTS

| | | |
|---|---|---|
| 4,918,497 A | 4/1990 | Edmond |
| 4,946,547 A | 8/1990 | Palmour et al. |
| 4,966,862 A | 10/1990 | Edmond |

(Continued)

FOREIGN PATENT DOCUMENTS

| | | |
|---|---|---|
| WO | WO 2013/082445 A1 | 6/2013 |
| WO | WO 2018/098041 A1 | 5/2018 |

OTHER PUBLICATIONS

International Search Report and Written Opinion for Application No. PCT/US2017/062307 dated Mar. 9, 2018.

(Continued)

*Primary Examiner* — Mohammad M Hoque
(74) *Attorney, Agent, or Firm* — Jenkins, Wilson, Taylor & Hunt, P.A.

(57) ABSTRACT

Devices, components and methods containing one or more light emitter devices, such as light emitting diodes (LEDs) or LED chips, are disclosed. In one aspect, a light emitter device component can include a metallic substrate with a mirrored surface, one or more light emitter devices mounted directly or indirectly on the mirrored surface, and one or more electrical components mounted on the top surface and electrically coupled to the one or more light emitter devices, wherein the one or more electrical components can be spaced from the mirrored metal substrate by one or more non-metallic layers. Components disclosed herein can result in improved thermal management and light output.

31 Claims, 7 Drawing Sheets

(51) Int. Cl.
*H01L 33/62* (2010.01)
*H01L 33/64* (2010.01)

(52) U.S. Cl.
CPC .............. *H05K 2201/10106* (2013.01); *H05K 2201/2054* (2013.01); *H05K 2203/049* (2013.01)

(56) References Cited

U.S. PATENT DOCUMENTS

| | | |
|---|---|---|
| 5,027,168 A | 6/1991 | Edmond |
| 5,200,022 A | 4/1993 | Kong et al. |
| 5,210,051 A | 5/1993 | Carter |
| 5,338,944 A | 8/1994 | Edmond et al. |
| 5,359,345 A | 10/1994 | Hunter |
| RE34,861 E | 2/1995 | Davis et al. |
| 5,393,993 A | 2/1995 | Edmond et al. |
| 5,416,342 A | 5/1995 | Edmond et al. |
| 5,523,589 A | 6/1996 | Edmond et al. |
| 5,604,135 A | 2/1997 | Edmond et al. |
| 5,631,190 A | 5/1997 | Negley |
| 5,739,554 A | 4/1998 | Edmond et al. |
| 5,912,477 A | 6/1999 | Negley |
| 6,120,600 A | 9/2000 | Edmond et al. |
| 6,187,606 B1 | 2/2001 | Edmond et al. |
| 6,201,262 B1 | 3/2001 | Edmond et al. |
| 6,600,175 B1 | 7/2003 | Baretz et al. |
| 6,791,119 B2 | 9/2004 | Slater et al. |
| 6,853,010 B2 | 2/2005 | Slater et al. |
| 6,958,497 B2 | 10/2005 | Emerson et al. |
| 7,095,056 B2 | 8/2006 | Vitta et al. |
| 7,213,940 B1 | 5/2007 | Van de Ven et al. |
| 7,456,499 B2 | 11/2008 | Loh et al. |
| 7,564,180 B2 | 7/2009 | Brandes |
| 7,655,957 B2 | 2/2010 | Loh et al. |
| 7,802,901 B2 | 9/2010 | McMillan |
| 7,821,023 B2 | 10/2010 | Yuan et al. |
| 7,952,544 B2 | 5/2011 | Roberts |
| 7,960,819 B2 | 6/2011 | Loh et al. |
| 7,999,283 B2 | 8/2011 | Chakraborty et al. |
| 8,018,135 B2 | 9/2011 | Van de Ven et al. |
| 8,044,418 B2 | 10/2011 | Loh et al. |
| D650,760 S | 12/2011 | Hussell et al. |
| 8,125,137 B2 | 2/2012 | Medendorp et al. |
| D667,803 S | 9/2012 | Hussell et al. |
| 8,264,138 B2 | 9/2012 | Negley et al. |
| 8,337,071 B2 | 12/2012 | Negley et al. |
| D676,000 S | 2/2013 | Hussell et al. |
| D676,395 S | 2/2013 | Hussell et al. |
| 8,455,908 B2 | 6/2013 | Welch et al. |
| 8,563,339 B2 | 10/2013 | Tarsa et al. |
| 8,564,000 B2 | 10/2013 | Hussell |
| 8,575,639 B2 | 11/2013 | Hussell |
| 8,624,271 B2 | 1/2014 | Reiherzer |
| D702,653 S | 4/2014 | Wilcox et al. |
| D705,181 S | 5/2014 | Hussell et al. |
| 8,729,589 B2 | 5/2014 | Hussell et al. |
| D706,231 S | 6/2014 | Hussell et al. |
| D707,192 S | 6/2014 | Hussell et al. |
| 8,809,880 B2 | 8/2014 | Hussell |
| D712,850 S | 9/2014 | Welch et al. |
| 8,866,410 B2 | 10/2014 | Negley et al. |
| 8,921,869 B2 | 12/2014 | Welch et al. |
| D721,339 S | 1/2015 | Hussell et al. |
| 8,970,131 B2 | 3/2015 | Brandes et al. |
| 8,994,057 B2 | 3/2015 | Hussell |
| 9,000,470 B2 | 4/2015 | Tudorica |
| 9,024,349 B2 | 5/2015 | Chitnis et al. |
| D736,725 S | 8/2015 | Wilcox et al. |
| D739,565 S | 9/2015 | Welch et al. |
| 9,131,561 B2 | 9/2015 | Athalye |
| D740,453 S | 10/2015 | Welch et al. |
| 9,159,888 B2 | 10/2015 | Chitnis et al. |
| 9,194,567 B2 | 11/2015 | Hussell et al. |
| 9,203,004 B2 | 12/2015 | Hussell et al. |
| 9,209,354 B2 | 12/2015 | Hussell et al. |
| 9,252,337 B1* | 2/2016 | Cumpston ............... H01L 33/20 |
| 9,277,605 B2 | 3/2016 | Ni |
| 9,300,062 B2 | 3/2016 | Hussell et al. |
| 9,414,454 B2 | 8/2016 | Brandes et al. |
| 9,490,235 B2 | 11/2016 | Edmond et al. |
| D823,492 S | 7/2018 | Welch et al. |
| 10,134,961 B2 | 11/2018 | Reiherzer et al. |
| 10,222,032 B2 | 3/2019 | Reiherzer et al. |
| 2003/0068877 A1* | 4/2003 | Kinsman ........... H01L 23/49827 438/599 |
| 2004/0207073 A1 | 10/2004 | Hasebe |
| 2006/0186418 A1 | 8/2006 | Edmond et al. |
| 2006/0199394 A1* | 9/2006 | Takahashi .............. C09K 13/00 438/754 |
| 2006/0221272 A1 | 10/2006 | Negley et al. |
| 2007/0057364 A1* | 3/2007 | Wang ........................ C03C 8/02 257/701 |
| 2007/0104828 A1 | 5/2007 | Fornaguera |
| 2008/0258130 A1 | 10/2008 | Bergmann et al. |
| 2009/0050908 A1 | 2/2009 | Yuan et al. |
| 2010/0141182 A1* | 6/2010 | Shi ........................ H01L 33/507 315/363 |
| 2010/0294543 A1 | 11/2010 | Sohn |
| 2011/0068702 A1 | 3/2011 | Van de Ven et al. |
| 2012/0012880 A1* | 1/2012 | Lee ........................ H01L 33/642 257/98 |
| 2012/0094442 A1* | 4/2012 | Lin ........................ H05K 1/021 438/118 |
| 2013/0258658 A1 | 10/2013 | Hussell |
| 2013/0299218 A1 | 11/2013 | Inagaki |
| 2014/0027795 A1 | 1/2014 | Reiherzer et al. |
| 2014/0070235 A1* | 3/2014 | Andrews ................. H01L 24/48 257/88 |
| 2014/0217433 A1* | 8/2014 | Tudorica ............. H01L 25/0753 257/89 |
| 2014/0291706 A1* | 10/2014 | Lin ........................ H01L 33/52 257/88 |
| 2015/0257211 A1* | 9/2015 | Johnson ............... H05B 33/089 315/121 |
| 2015/0282260 A1 | 10/2015 | Hussell |
| 2016/0165695 A1* | 6/2016 | Gershowitz ........ H05B 33/0803 315/297 |
| 2017/0118810 A1* | 4/2017 | Wimmer ............ H05B 33/0845 |

OTHER PUBLICATIONS

Restriction Requirement for U.S. Appl. No. 14/043,494 dated Mar. 20, 2014.
Non-Final Office Action for U.S. Appl. No. 14/043,494 dated Jun. 20, 2014.
Notice of Allowance for U.S. Appl. No. 14/043,494 dated Dec. 10, 2014.
Notice of Allowance for U.S. Appl. No. 14/043,494 dated Apr. 17, 2015.
Notice of Allowance for U.S. Appl. No. 14/043,494 dated Jul. 30, 2015.

* cited by examiner

| PRODUCT | TEMP | CURRENT | $T_{LES}$ HRA | $T_{LES}$ AL | DELTA |
|---------|------|---------|---------|--------|-------|
| CXB1512 | 85 | 350 | 107.4 | 101.7 | -5.7 |
| CXB1512 | 85 | 600 | 128.6 | 115.5 | -13.0 |
| CXB1512 | 85 | 1050 | 186.7 | 142.5 | -44.2 |
| CXB1512 | 105 | 350 | 127.4 | 121.7 | -5.7 |
| CXB1512 | 105 | 600 | 148.6 | 135.5 | -13.0 |
| CXB1512 | 105 | 800 | 169.4 | 147.3 | -22.1 |
FIG. 7A
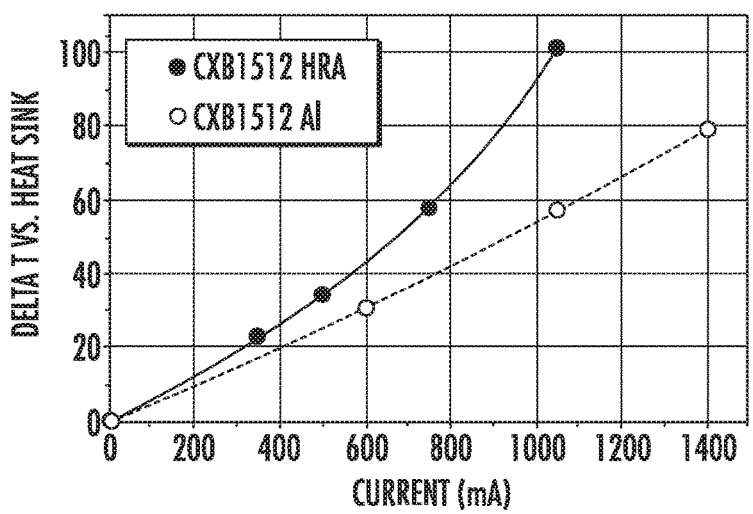
FIG. 7B
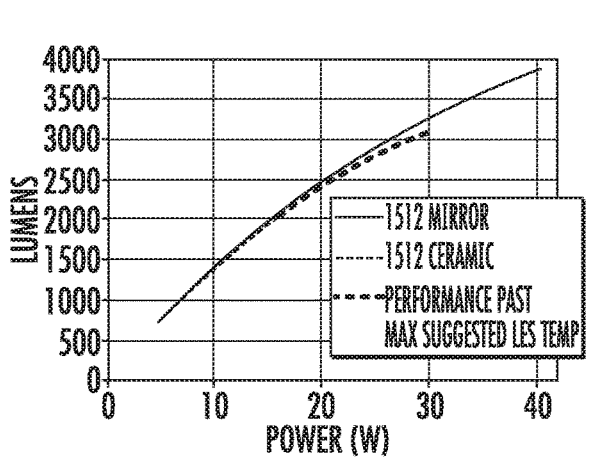
FIG. 7C
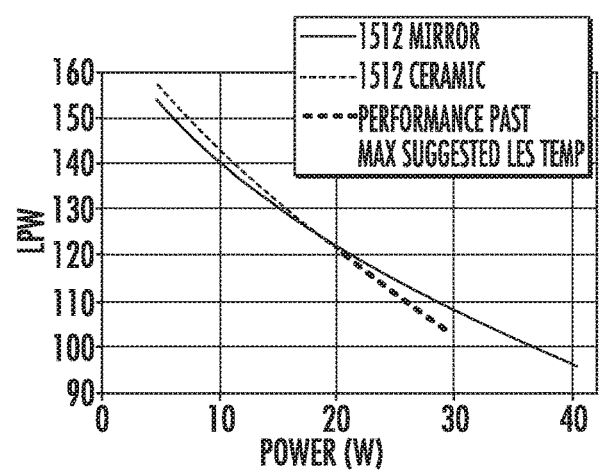
FIG. 7D

LIGHT EMITTING DIODE (LED) DEVICES, COMPONENTS AND METHODS

TECHNICAL FIELD

The subject matter disclosed herein relates generally to components, modules, and methods for light emitting diode (LED) lighting. More particularly, the subject matter disclosed herein relates to multi-layered LED devices, components and methods with improved performance and manufacturability.

BACKGROUND

Optoelectronic devices utilizing light emitters or light emitter devices, such as light emitting diodes (LEDs) or LED components, have various applications in consumer electronics. One or more high brightness LED chips, for example, can be packaged within surface mount device (SMD) housings or in top-mount configurations for use as light sources in space-limited applications where thermal management and size can be important. Some high brightness LED chips can be housed in plastic, leaded chip carriers (PLCCs) or in or on ceramic, metal and/or mirrored substrates. The LED chips and/or LED housings can be improved for efficiency, brightness, durability and/or manufacturability. Typical end-products for LED chips packaged within SMD housings include for example, but are not limited to, LED light bulbs, commercial/residential directional lighting, general indoor/outdoor illumination, commercial displays, indoor cabinet displays, flashes for cameras, retail and window displays, emergency lighting and signs, household appliances, and television and automotive instrument panels.

An area of improvement of LED components includes increasing thermal conductivity and capacity for increased power inputs while maintaining optimal performance. Moreover, improved durability of the LED packages is desired. Packages for high power or high wattage applications can incorporate various design features for increasing the lumens per watt (LPW) or lumens per dollar (LP$). Design features for increasing thermal conductivity and high power capacity, as well as durability, can include, for example, a substrate comprising metal and a mirror, and/or a plurality of dielectric layers, prepregs, solder masks, and combinations thereof. Other areas of improvement for LED components include incorporation of design features which improve, for example, thermal properties and/or minimizing overall size, or footprint, to efficiently utilize space when mounted to an external source.

Accordingly, there remains a need for improved light emitter device components, modules, and methods that overcome or alleviate shortcomings of prior light emitter device components, modules and methods. Specifically, for example, there exists a need for improved thermal capacity LEDs, LED components and methods that are more durable and can be produced at reduced cost, higher manufacturability, and higher yield than existing devices.

SUMMARY

In accordance with this disclosure, light emitting diode (LED) devices, components, and methods are provided. It is, therefore, an object of the present disclosure to provide light emitter device components, modules and methods improving thermal conductivity, power handling capabilities and durability.

These and other objects as can become apparent from the disclosure herein are achieved, at least in whole or in part, by the subject matter described herein.

BRIEF DESCRIPTION OF THE DRAWINGS

A full and enabling disclosure of the present subject matter is set forth more particularly in the remainder of the specification, including reference to the accompanying figures, relating to one or more embodiments, in which:

FIGS. 7A, 7B, 7C and 7D are tabular and graphical illustrations of the thermal properties of light emitter device components according to the present subject matter.

DETAILED DESCRIPTION

Figure 1:
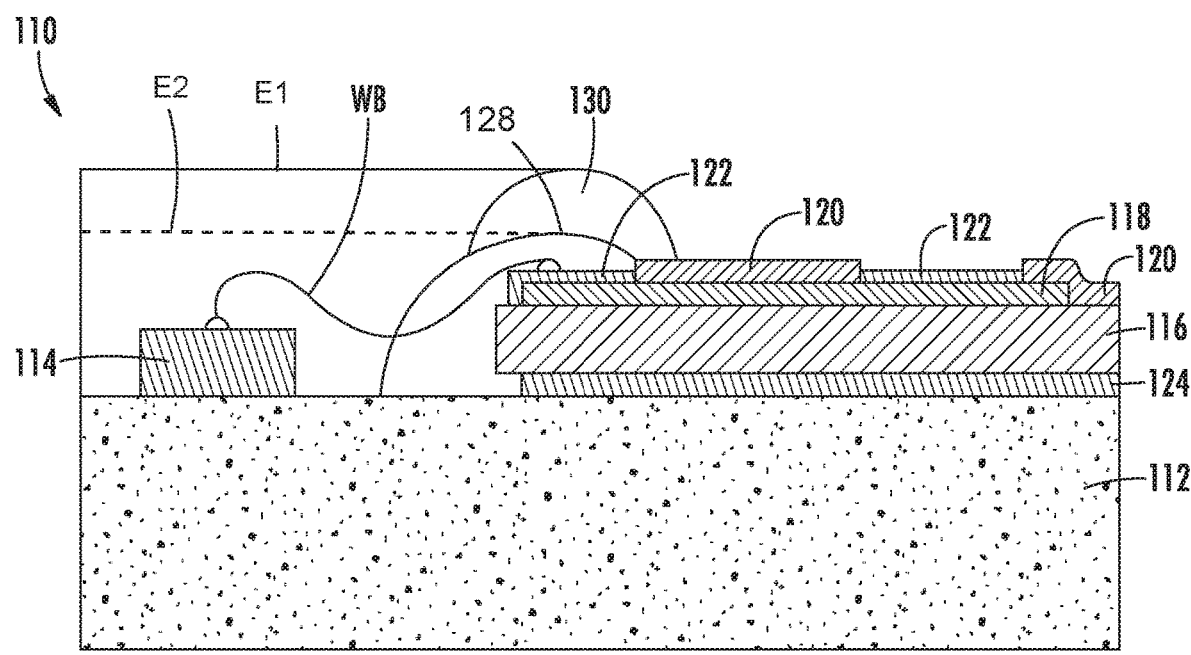
FIG. 1 is a cross-sectional side view illustrating a light emitter device component according to embodiments of the present subject matter.

Reference will now be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

In some aspects, solid state lighting apparatuses, LED devices and/or systems, and methods for producing the same, described herein can comprise various solid state light emitter electrical configurations, color combinations, and/or circuitry components for providing solid state lighting apparatuses having improved efficiency, improved emission profiles, enhanced output and/or optimized color production. Apparatuses and methods such as those disclosed herein advantageously cost less, are more efficient, vivid, uniform, and/or brighter than some other solutions.

Unless otherwise defined, terms used herein should be construed to have the same meaning as commonly understood by one of ordinary skill in the art to which this subject matter belongs. It will be further understood that terms used herein should be interpreted as having a meaning that is consistent with the respective meaning in the context of this specification and the relevant art, and should not be interpreted in an idealized or overly formal sense unless expressly so defined herein.

Aspects of the subject matter are described herein with reference to sectional, perspective, elevation, and/or plan view illustrations that are schematic illustrations of idealized aspects of the subject matter. Variations from the shapes of the illustrations as a result, for example, of manufacturing techniques and/or tolerances, are to be expected, such that aspects of the subject matter should not be construed as limited to particular shapes illustrated herein. This subject matter can be embodied in different forms and should not be construed as limited to the specific aspects or embodiments set forth herein. In the drawings, the size and relative sizes of layers and regions can be exaggerated for clarity.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions. Likewise, if devices in the figures are rotated along an axis, structure or portion described as "above", other structures or portions would now be oriented "next to" or "left of" the other structures or portions. Like numbers refer to like elements throughout.

Unless the absence of one or more elements is specifically recited, the terms "comprising", "including", and "having" as used herein should be interpreted as open-ended terms that do not preclude the presence of one or more elements.

The terms "electrically activated emitter(s)" and "emitter(s)" as used herein are synonymous terms and refer to any device capable of producing visible or near visible (e.g., from infrared to ultraviolet) wavelength radiation, including for example but not limited to, xenon lamps, mercury lamps, sodium lamps, incandescent lamps, and solid state emitters, including LEDs or LED chips, organic light emitting diodes (OLEDs), and lasers.

The terms "solid state light emitter(s)", "solid state emitter(s)", and "light emitter(s)" are synonymous terms and refer to an LED chip, a laser diode, an organic LED chip, and/or any other semiconductor device preferably arranged as a semiconductor chip that comprises one or more semiconductor layers, which can comprise silicon, silicon carbide, gallium nitride and/or other semiconductor materials, a substrate which can comprise sapphire, silicon, silicon carbide and/or other microelectronic substrates, and one or more contact layers which can comprise metal and/or other conductive materials.

The terms "groups", "segments", "strings", and "sets" as used herein are synonymous terms. As used herein, these terms generally describe how multiple LEDs are electrically connected, such as in series, in parallel, in mixed series/parallel, in common anode, or in common anode configurations among mutually exclusive groups/segments/sets. The segments of LEDs can be configured in a number of different ways and may have circuits of varying functionality associated therewith (e.g. driver circuits, rectifying circuits, current limiting circuits, shunts, bypass circuits, etc.), as discussed, for example, in commonly assigned and co-pending U.S. patent application Ser. No. 12/566,195, filed on Sep. 24, 2009, U.S. patent application Ser. No. 13/769,273, filed on Feb. 15, 2013, U.S. patent application Ser. No. 13/769,277 filed on Feb. 15, 2013, U.S. patent application Ser. No. 13/235,103, filed on Sep. 16, 2011, U.S. patent application Ser. No. 13/235,127, filed on Sep. 16, 2011, and U.S. Pat. No. 8,729,589, which issued on May 20, 2014, the disclosure of each of which is hereby incorporated by reference herein in the entirety.

The term "targeted" refers to configurations of LED chip segments that are configured to provide a pre-defined lighting characteristic that is a specified parameter for the lighting apparatus. For example, the targeted spectral power distribution can describe the characteristic of the light that is generated at a particular power, current, or voltage level.

Apparatuses, systems, and methods as disclosed herein can utilize red chips, green chips, and blue chips. In some aspects, chips for use in blue-shifted yellow light (BSY) devices can target different bins as set forth in Table 1 of commonly owned, assigned, and co-pending U.S. patent application Ser. No. 12/257,804, published as U.S. Pat. Pub. No. 2009/0160363, the disclosure of which is incorporated by reference herein in the entirety. Apparatuses, systems, and methods herein can utilize, for example, ultraviolet (UV) chips, cyan chips, blue chips, green chips, red chips, amber chips, and/or infrared chips.

The term "substrate" as used herein in connection with lighting apparatuses refers to a mounting member or element on which, in which, or over which, multiple solid state light emitters (e.g., LEDs) can be arranged, supported, and/or mounted. A substrate can be, e.g., a component substrate, a chip substrate (e.g., an LED substrate), or a sub-panel substrate. Exemplary substrates useful with lighting apparatuses as described herein can for example comprise printed circuit boards (PCBs) and/or related components (e.g., including but not limited to metal core printed circuit boards (MCPCBs), flexible circuit boards, dielectric laminates, ceramic based substrates, and the like), ceramic boards having FR4 and/or electrical traces arranged on one or multiple surfaces thereof, high reflectivity ceramics (e.g., alumina) support panels, and/or mounting elements of various materials and conformations arranged to receive, support, and/or conduct electrical power to solid state emitters.

Electrical traces described herein provide electrical power to the emitters for electrically activating and illuminating the emitters. Electrical traces may be visible and/or covered via a reflective covering, such as a solder mask material, Ag, or other suitable reflector.

In some embodiments one substrate can be used to support multiple groups of solid state light emitters in addition to at least some other circuits and/or circuit elements, such as a power or current driving components and/or current switching components. In other aspects, two or more substrates (e.g., at least a primary substrate and one or more secondary substrate or substrates) can be used to support multiple groups of solid state light emitters in addition to at least some other circuits and/or circuit elements, such as a power or current driving components and/or temperature compensation components. The first and second (e.g., primary and secondary) substrates can be disposed above and/or below each other and along different planes, adjacent (e.g., side-by-side) to each other, have one or more co-planar surfaces disposed adjacent each other, arranged vertically, arranged horizontally, and/or arranged in any other orientation with respect to each other.

Solid state lighting apparatuses according to aspects of the subject matter herein can comprise III-V nitride (e.g., gallium nitride) based LEDs or laser chips fabricated on a silicon, silicon carbide, sapphire, or III-V nitride growth substrate, including (for example) LEDs manufactured and sold by Cree, Inc. of Durham, N.C. Such LEDs and/or lasers can be configured to operate such that light emission occurs through the substrate in a so-called "flip chip" orientation. Such LED and/or laser chips can also be devoid of growth substrates (e.g., following growth substrate removal). In some cases, LEDs can comprise red—III-V chips, but not nitride such as InGaAlP, GaAsP, and the like.

LEDs useable with lighting apparatuses as disclosed herein can comprise horizontal structures (with both electrical contacts on a same side of the LED chip) and/or vertical structures (with electrical contacts on opposite sides of the LED chip). A horizontally structured chip (with or without the growth substrate), for example, can be flip chip bonded (e.g., using solder) to a carrier substrate or printed circuit board (PCB), or wire bonded. A vertically structured chip (without or without the growth substrate) can have a first terminal solder bonded to a carrier substrate, mounting pad, or printed circuit board (PCB), and have a second terminal wire bonded to the carrier substrate, electrical element, or PCB.

Electrically activated light emitters, such as solid state emitters, can be used individually or in groups to emit light to stimulate emissions of one or more lumiphoric materials (e.g., phosphors, scintillators, lumiphoric inks, quantum dots), and generate light at one or more peak wavelengths, or of at least one desired perceived color (including combinations of colors that can be perceived as white). Inclusion of lumiphoric (also called 'luminescent') materials in lighting apparatuses as described herein can be accomplished by an application of a direct coating of the material on lumiphor support elements or lumiphor support surfaces (e.g., by powder coating, inkjet printing, or the like), adding such materials to lenses, and/or by embedding or dispersing such materials within lumiphor support elements or surfaces. Methods for fabricating LEDs having a planarized coating of phosphor integrated therewith are discussed by way of example in U.S. Patent Application Publication No. 2008/0179611, filed on Sep. 7, 2007, to Chitnis et al., the disclosure of which is hereby incorporated by reference herein in the entirety.

Other materials, such as light scattering elements (e.g., particles) and/or index matching materials can be associated with a lumiphoric material-containing element or surface. Apparatuses and methods as disclosed herein can comprise LEDs of different colors, one or more of which can be white emitting (e.g., including at least one LED with one or more lumiphoric materials).

In some aspects, one or more short wavelength solid state emitters (e.g., blue and/or cyan LEDs) can be used to stimulate emissions from a mixture of lumiphoric materials, or discrete layers of lumiphoric material, including red, yellow, and green lumiphoric materials. LEDs of different wavelengths can be present in the same group of solid state emitters, or can be provided in different groups of solid state emitters. A wide variety of wavelength conversion materials (e.g., luminescent materials, also known as lumiphors or lumiphoric media, e.g., as disclosed in U.S. Pat. No. 6,600,175, issued on Jul. 29, 2003, and U.S. Patent Application Publication No. 2009/0184616, filed on Oct. 9, 2008, each disclosure of which is hereby incorporated by reference herein in the entirety), are well-known and available to persons of skill in the art.

In some aspects, lighting apparatuses and systems as described herein comprise multiple sets of solid state light emitters targeting different colors (e.g., one set targeting a first color and at least a second set targeting a second color that is different than the first color). In some aspects, each set of the multiple sets comprises at least two solid state light emitters of a same color (e.g., the peak wavelengths coincide). In some aspects, each set of the multiple sets of solid state emitters is adapted to emit one or more different color(s) of light. In some aspects, each set of the multiple sets of solid state emitters is adapted to emit one or more color(s) of light that differ relative to one another (e.g., with each set of solid state emitters emitting at least one peak wavelength that is not emitted by another set of solid state emitters). Aspects of targeting and selectively activating sets of solid state emitters according to the present subject matter may be provided using the circuitry and/or techniques described in commonly assigned and co-pending U.S. patent application Ser. No. 14/221,839, the disclosure of which was previously incorporated hereinabove by reference.

The term "color" in reference to a solid state emitter refers to the color and/or wavelength of light that is emitted by the chip upon passage of electrical current therethrough.

Some embodiments of the present subject matter may use solid state emitters, emitter packages, fixtures, luminescent materials/elements, power supply elements, control elements, and/or methods such as described in U.S. Pat. Nos. 7,564,180; 7,456,499; 7,213,940; 7,095,056; 6,958,497; 6,853,010; 6,791,119; 6,600,175, 6,201,262; 6,187,606; 6,120,600; 5,912,477; 5,739,554; 5,631,190; 5,604,135; 5,523,589; 5,416,342; 5,393,993; 5,359,345; 5,338,944; 5,210,051; 5,027,168; 5,027,168; 4,966,862, and/or 4,918,497, and U.S. Patent Application Publication Nos. 2009/0184616; 2009/0080185; 2009/0050908; 2009/0050907; 2008/0308825; 2008/0198112; 2008/0179611, 2008/0173884, 2008/0121921; 2008/0012036; 2007/0253209; 2007/0223219; 2007/0170447; 2007/0158668; 2007/0139923, and/or 2006/0221272; U.S. patent application Ser. No. 11/556,440, filed on Dec. 4, 2006; with the disclosures of the foregoing patents, published patent applications, and patent application serial numbers being hereby incorporated by reference as if set forth fully herein.

The terms "lighting apparatus" and "module" as used herein are synonymous, and are not limited, except that it is capable of emitting light. That is, a lighting apparatus can be a device or apparatus that illuminates an area or volume, e.g., a structure, a swimming pool or spa, a room, a warehouse, an indicator, a road, a parking lot, a vehicle, signage (e.g., road signs, a billboard), a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., backlight poster, signage, LCD displays), light bulbs, bulb replacements (e.g., for replacing AC incandescent lights, low voltage lights, fluorescent lights, etc.), outdoor lighting, security lighting, exterior residential lighting (wall mounts, post/column mounts), ceiling fixtures/wall sconces, under cabinet lighting, lamps (floor and/or table and/or desk), landscape lighting, track lighting, task lighting, specialty lighting, rope lights, ceiling fan lighting, archival/art display lighting, high vibration/impact lighting-work lights, etc., mirrors/vanity lighting, spotlighting, high-bay lighting, low-bay lighting, or any other light emitting device.

The presently disclosed subject matter is directed to different embodiments of LED package structures having a light source that comprises LEDs. The LED packages can be arranged in different ways and are relatively small, while at the same time are efficient, reliable and cost effective. The embodiments according to the disclosure herein can have different shaped encapsulants, but can emit with improved or similar efficiency compared to similar LED packages with fully hemispheric encapsulants. In some embodiments where a plurality of LEDs are mounted on a substrate, the spacing between each LED chip can be controlled to optimize the intensity of light output from the LED package. The LED packages according to the disclosure herein can also be smaller and less expensive to manufacture.

In some embodiments, the LED packages can have encapsulants with planar surfaces that result in a certain amount of light experiencing total internal reflection (TIR) within the encapsulant. Using planar surfaces can provide increased flexibility in the different shapes that can be used beyond conventional hemispheric lenses that are typically arranged to minimize TIR light, and the use of planar surfaces can allow for more compact LED packages. Some embodiments can comprise one or more LEDs on a submount with contacts and traces for applying an electrical signal to the one or more LEDs. The LED and the surface around the LED can be blanketed by a layer of phosphor material. In some embodiments the encapsulant can comprise a transparent material that is in a cubic or generally cubic shape over the LED and the submount. The conversion material layer can be of the type that converts light from the LED to another color or wavelength of light, and the conversion layer can be of a thickness and concentration such that less than all of the LED light is converted on its first pass through the conversion material.

Different LED packages according to the disclosure herein can have different shaped encapsulants to produce the desired emission profile and emission efficiency. Some embodiments can comprise encapsulants where not all of the surfaces are planar, with some comprising a hybrid combination of planar and curved surfaces. Some of these embodiments can comprise one or more LEDs mounted on a submount, with the encapsulant having an upper curved surface and planar side surfaces. The upper surface can have a radius of curvature that is greater than half the length or width of the submount, with the planar surfaces comprising truncated sections of the encapsulant so that the encapsulant does not overhang the edge of the submount. This can result in planar surfaces with a curved edge as described below. LED packages with planar encapsulants and planar/curved encapsulants are fully described in U.S. patent application Ser. No. 13/957,290, entitled "LED Package with Encapsulant Having Curved and Planar Surfaces," which is incorporated herein by reference in the entirety.

The disclosure herein can in some embodiments be directed to a number of different features and arrangements that can improve or tailor the emission characteristics of LED packages according to the disclosure herein. These can include, but are not limited to, improved phosphor layer compositions and coverage, the use of particular silicones in different layers, the grouping of LEDs, a truncated (or cubic) encapsulant, spacing between a plurality of LEDs, the arrangement of phosphor layers, and/or improved coverage of reflective layers. In some embodiments, the use of some or all of these features can result in LED packages emitting light at improved lumen density.

The disclosure herein is described herein with reference to certain embodiments, but it is understood that the disclosure herein can be embodied in many different forms and should not be construed as limited to the embodiments set forth herein. In particular, the disclosure herein is described below in regards to certain LED packages having LEDs in different configurations, but it is understood that the disclosure herein can be used for many other LED packages with other LED configurations. The LED packages can also have many different shapes beyond those described below, such as rectangular, and the solder pads and attach pads can be arranged in many different ways. In other embodiments, the emission intensity of the different types of LEDs can be controlled to vary the overall LED package emission.

The embodiments described herein are with reference to an LED or LEDs, but in accordance with the disclosure herein and in some aspects LEDs as used herein can include LED chips or any other suitable structure or structures. For example, LEDs as used herein can be individual junctions of a monolithic LED. For example, instead of being completely separate LED chips, the LEDs can each be a LED region all on a common substrate that can have different types of monolithic junctions. A mesa between the LEDs and on the common substrate can extend to certain layers or can extend all the way to or from the common substrate. Therefore, a monolithic LED can comprise more than one LED junctions on a common substrate, and the gaps between the LEDs can be formed by the mesas that can at least partially separate the LEDs.

The components described herein can have different shapes and sizes beyond those shown, and one or different numbers of LEDs can be included. It is also understood that the embodiments described below utilize co-planar light sources, but it is understood that non co-planar light sources can also be used. It is also understood that an LED light source may be comprised of multiple LEDs that may have different emission wavelengths. As mentioned above, in some embodiments at least some of the LEDs can comprise blue emitting LEDs covered with a yellow phosphor along with red emitting LEDs, resulting in a white light emission from the LED package. In multiple LED packages, the LEDs can be serially interconnected or can be interconnected in different serial and parallel combinations.

Embodiments of the present disclosure are described herein with reference to cross-sectional view illustrations that are schematic illustrations of embodiments of the disclosure. As such, the actual thickness of the layers can be different, and variations from the shapes of the illustrations as a result, for example, of manufacturing techniques and/or tolerances are expected. Embodiments of the disclosure should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the disclosure herein.

The disclosure herein provides improvements over previously disclosed LED packages, devices and/or components. One of the advantages of LED packages according to the disclosure herein is that they are configured be more robust against improper handling. For example, and as discussed in more detail hereinbelow, the different LED package embodiments of the disclosure herein can comprise a plurality of printed circuit board (PCB) layers configured to surround LED chips and associated wired bonds, which in some embodiments can provide an additional degree of strength to the LED package and/or provide a protective feature for the LED chips, wire bonds, etc. Moreover, in some aspects retention material, or dams, can be coupled with the one or more PCBs, as well as in some embodiments encapsulants, to protect the LEDs and/or wire bonds from improper handling.

The disclosure herein also provides for a number of improvements, including but not limited to improved light reflectivity, thermal conductivity, and/or efficiency. In some aspects LED packages and/or components provided herein can be configured to be capable of handling higher power inputs while still maintaining thermal conductivity. In some aspects LED packages and/or components provided herein can be configured to produce an improved, increased and/or optimized lumen output per input (i.e. high lumen per dollar (LP$)).

Provided in some embodiments are light emitter device components comprising a metallic substrate having a top surface, a mirrored surface on at least a portion of the top surface of the metallic substrate, one or more light emitter devices mounted on the top surface of the metallic substrate or the mirrored surface, and one or more electrical components mounted on the top surface of the metallic substrate and electrically coupled to the one or more light emitter devices, wherein the one or more electrical components are spaced from the metallic substrate by a plurality of non-metallic layers. The non-metallic layers can comprise one or more dielectric layers, such as for example a polyimide-based polymer. Moreover, the dielectric layers can comprise a printed circuit board (PCB), including FR-4, CEM-3, CEM-4, or related composite materials.

In some aspects, and as discussed further herein, at least two PCBs are layered one on top of the other. Such a configuration can in some aspects further comprise a prepreg layer between the two PCB layers. The non-metallic layers, e.g. two or more PCBs, can increase the thermal conductivity of the light emitter device component as compared to a device with a non-metallic substrate without a plurality of non-metallic layers.

In some aspects the non-metallic layers are mounted to the metallic substrate and adjacent to the one or more light emitter devices. The height of the non-metallic layers can be configured to be greater than the height of the one or more light emitter devices, and can in some embodiments be configured to further comprise a retention material in contact with the non-metallic layers, wherein the retention material forms a dam surrounding the one or more light emitter devices. The height of the retention material can at least be as high as the non-metallic layers, and higher than the one or more light emitter devices. Moreover, the retention material can be configured to cover a wire bond electrically coupling the one or more light emitters devices to the one or more electrical components.

Methods of making the disclosed LED devices are also provided herein. For example, a method of forming a light emitter device component having improved thermal properties is provided, including mounting one or more light emitter devices on a top surface of a substrate, the substrate comprising a metallic base with mirrored upper surface, depositing a plurality of non-metallic layers on the top surface of the substrate and surrounding the one or more light emitter devices, and mounting one or more electrical components to at least one of the non-metallic layers, wherein the one or more electrical components are spaced from the substrate body by the non-metallic layers. The non-metallic layers can comprise dielectric layers, wherein the dielectric layers can comprise a PCB. In some aspects at least two PCBs can be layered one on top of another. In some aspects a prepreg layer can be applied between the two PCB layers. In some embodiments a solder mask can be applied on an upper surface of the non-metallic layers. In some aspects, the light emitter devices can be electrically coupled to the one or more electrical components by applying a wire bond.

In some embodiments the non-metallic layers can be positioned to form a stepped configuration with a recessed ledge between a first and second non-metallic layer, wherein at least one electrical component and wire bond can be positioned at the recessed ledge to provide a more protected location. In some aspects the height of the non-metallic layers can be configured to be greater than the height of the one or more light emitter devices.

In some aspects, a method can further comprise applying a retention material in contact with one or more of the non-metallic layers, wherein the retention material can form a dam surrounding the one or more light emitter devices. In some embodiments the height of the retention material can be at least as high as the non-metallic layers, and higher than the one or more light emitter devices.

Embodiments of the present subject matter will be described with reference to FIGS. 1-7. Referring now to FIGS. 1-6, a light emitter device component can comprise light emitter device components or LED components that can be mounted over a substrate, and can in some aspects include one or more PCBs, with in some aspects metal layers or metal plating near the die attach surface. The substrate can in some aspects be metallic or non-metallic (e.g., ceramic). Generally, it is desirable for the substrate to be highly reflective to visible light (e.g., greater than about 90%) and provide conduction of heat and mechanical support. For example, ceramic materials, including those containing alumina, are among the materials that contain these desirable qualities. In other embodiments, and as described further herein, metallic materials can be used as the substrate.

FIG. 1 illustrates a cross-sectional view of a light emitter package or LED component, generally designated 110. LED component 110 as shown for example in FIG. 1 can comprise a ceramic substrate or body 112 that can be of any suitable shape and configuration. In some embodiments the use of ceramic-based LED components, including substrate 112, can provide improved reflection and thus improved efficiency. Ceramic materials can further be desirable for use in LED components because of thermal management properties. For example, Alumina materials ($AL_2O_3$) have relatively low thermal resistance, low moisture sensitivity, superior reliability at high temperature environments, and the superior ability to dissipate heat. Thus, in some aspects ceramic can be highly reflective but have relatively low thermal conductivity, and can therefore be best suited for high efficiency, or high lumens per watt (LPW), applications. In one aspect, ceramic substrate 112 can comprise a ceramic body cast using low temperature co-fired ceramic (LTCC) materials and processes. Specifically, for example, ceramic substrate 112 can comprise a substrate cast from a thin green ceramic tape. The ceramic tape can comprise any ceramic filler material known in the art, for example, glass ceramics such as aluminum oxide ($Al_2O_3$) or aluminum nitride (AlN) having 0.3 to 0.5 weight percent of glass frits. The glass frits can be used as a binder and/or sintering inhibitor within the ceramic tape when the tape is fired. A green tape can be formed by casting a thick layer of a slurry dispersion of the glass frit, ceramic filler, one or more additional binders, and a volatile solvent. The cast layer can be heated at low temperatures to remove the volatile solvent. A green ceramic tape used for ceramic body 112 can advantageously comprise any thickness desired, thus contributing to a thinner size when desired. In another aspect, HTCC can be used. Ceramic body 112 can further comprise a ceramic material having any of a variety of scattering particle contained therein. Examples of suitable scattering particles can for example comprise particles of $Al_2O_3$, $TiO_2$, $BaSO_4$, and/or AlN. In one aspect, $Al_2O_3$ particles can be selected based on cost considerations, along with its mechanical, optical, electrical, and thermal properties. In still another aspect, the substrate can be a comparatively simple structure without intervening layers such as those produced by thin- or thick-film processes (e.g., bare substrates produced CoorsTek and several others). Such substrates can be fired along with other materials (e.g., Zirconia) to improve optical and mechanical properties.

Referring to FIG. 1, ceramic substrate 112 can for example be formed without any cavity or recess so that one or more LED chips 114 are disposed on and can mount to ceramic substrate 112. As one example, substrate 112 can comprise a surface, such as an upper surface, that can but does not have to be disposed along a single plane. The one or more LED chip(s), such as LED chip 114, can be mounted directly to the surface of body 112 with only a thin adhesive layer (e.g., silicone or epoxy) between substrate 112 and LED chip 114 (i.e., without any intervening layer, such as a metal or other layer, as shown for example in FIG. 1).

LED chip 114 can be electrically connected, such as by wirebonds WB or any other suitable technique, to one or more electrical components. Wirebond WB can comprise an electrically conductive wire or conduit material. As used herein, electrical components can, for example and without limitation, comprise electrical traces, leads, electrical pads, metal plating, contact or bond pads, or any other suitable electrical component. For example, metal plating 122 can comprise a copper foil having wire-bondable gold or silver portions provided thereon. In some instances two or more metal plates 122 can be provided and can serve as a cathode and the other as an anode for supplying LED chips 114 with current to illuminate an active layer within the LED chip. Such LED chips 114 can in some aspects be referred to as top-side contact chips or dies. Alternatively, LED chip 114 may be a flip-chip bonded to one or more electrical components, such as for example metal plating 122. Any other suitable bonding techniques could be used as well.

Regardless of the specific connection, metal plating 122 can in some embodiments be separated from ceramic substrate 112 by one or more additional layers or components. For instance, as shown in FIG. 1, an adhesive layer 124 can be applied to an upper surface of substrate 112, upon which a printed circuit board (PCB) base layer 116 can be positioned, upon which a PCB metal layer 118 can be positioned. Moreover, in some aspects a solder mask 120 can be positioned or layered on an upper surface, including on PCB metal layer 118, on PCB base layer 116, or both.

Adhesive layer 124 can be configured to adhere PCB 116 to substrate 112. Adhesive layer 124 can comprise, for example, an organic-based adhesive, a pressure-sensitive adhesive (PSA), and/or an epoxy or silicone adhesive.

By connecting LED chip 114 and electrical components/metal plating 122 to substrate 112 using one or more intervening layers, e.g., adhesive layer 124, PCB base layer 116 and/or PCB metal layer 118, the manufacturability of LED component 110 can in some embodiments be greatly improved. Specifically, for example, prior art methods can in some aspects require resource-intensive processes in which a seed layer is deposited on the substrate by physical vapor deposition or the like, and copper is plated on the seed layer to produce electrical traces on the substrate. Other metals are typically plated on the copper to make them wire-bondable. Such methods can require a number of additional processing steps with respect to substrate 112, and these additional processing steps can leave contaminates on the ceramic surface, which can be difficult to remove and can negatively impact the performance (e.g., brightness) and reliability of the device. In contrast, using one or more intervening layers can in some aspects allow metal plating 122 to be adhered to substrate 112 in a comparatively simpler process. In such a configuration, the trace pattern can be formed separate from substrate 112 and applied using a lamination technique, such as for example a heat press and/or an overpressure chamber (i.e., autoclave) lamination technique with an adhesive film known to those having skill in the art in the multi-layer printed circuit board industry.

Printed circuit boards 116/118 can comprise a flexible printed circuit board ("flextape" PCB), such as PCB base 116, comprising a polymer-like film, that can have at least one conductive layer, such as PCB metal 118, within one or more layers of a flexible plastic resin (e.g., polyimide, Kapton from DuPont). In some aspects adhesive layer 124 can comprise a tape-like adhesive provided on the flextape for easy connection of PCB 116/118 to substrate 112. It should be recognized, however, that PCB 116/118 can comprise any material used in multilayer PCBs or flex PCBs, including prepreg materials, reinforced laminates (e.g., glass-reinforced epoxy, materials using carbon fiber), and non-reinforced materials.

As further illustrated in FIG. 1, additional components can be integrated into LED component 110 to improve the performance and manufacturability thereof. For example, LED component 110 can further comprise an electrically insulating solder mask 120 in one or more locations, particularly on an upper surface of component 110. Solder mask 120 can be disposed on PCB 116/118, and in some embodiments at least partially on and/or adjacent to metal plating 122, such that when solder is used to attach one or more wires to an electrical solder pad (not shown), the solder will be contained within the predefined area. Choosing a white solder mask can improve the overall reflectivity of LED component 110.

LED component 110 can further comprise a retention material such as retention material 128 or 130 disposed at least partially about an emission area in which LED chip 114 is positioned, where retention material 128/130 can be referred to as a dam. Retention material 128/130 can for example be dispensed. After application or placement of retention material 128/130, such as for example by dispensing of retention material 128/130, an encapsulant E can be disposed within the recess formed thereby. An encapsulant such as encapsulant E1 or E2 can contain one or more phosphors such that light emitted from the one or more LED chips 114 can produce an emission of a desired wavelength. Encapsulant E1 or E2 can be selectively filled to any suitable level within the space disposed between one or more inner walls of retention material 128/130. For example, encapsulant E1/E2 can be filled to a level proximate or equal to a height of retention material 128/130 or to any level above or below the retention material. The level of encapsulant E can be planar or curved in any suitable manner, such as concave or convex. Retention material 128 can be dispensed first, and retention material 130 can subsequently and separately (or simultaneously) be dispensed. Retention material 128 only can be dispensed, without also having the extra height of retention material 130, wherein the height of retention material 128 then allows for the level of encapsulant to be lower (such as shown by the broken line below the top line of encapsulant E2) than what the level could be (E1) when retention material 130 is also used. By also using retention material 130, however, the increased height of retention material 130 allows for the level of encapsulant E1 to be higher and/or allows for use of possible secondary optics that can be proximate to, even with, or even above the vertical height of retention material 140.

In some aspects retention material 128/130 can be configured to have a height at least as tall as PCB 116/118, and/or at least at tall as metal plating 122, and in some aspects, as shown in FIG. 1, taller than the upper surface of metal plating 122 and/or solder mask 120. Such a configuration allows for wire bond WB, and particularly the connection of the wire bond to the metal plating, to be protected by retention material 128/130. In some aspects, retention material 128/130 can be applied in two layers to achieve the desired height, i.e. a first layer applied to fill the step up between the upper surface of substrate 112 and the edge of PCB 116/118, and the second applied on top of the first layer of retention material to cover wire bond WB. In some embodiments, wire bond WB can optionally comprise an "M-loop" shape, such as disclosed in U.S. Pat. No. D753,612 commonly owned herewith.

Figure 2A:
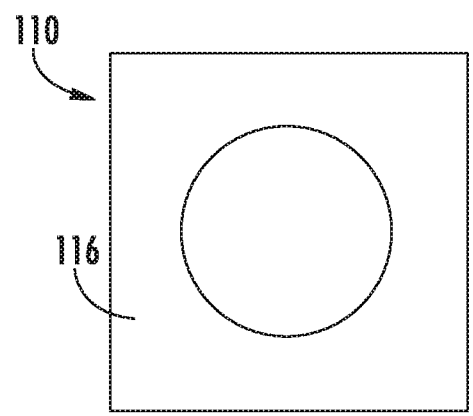
FIGS. 2A, 2B and 2C are top plan views of light emitter device components illustrating further embodiments of the present subject matter.
Figure 2B:
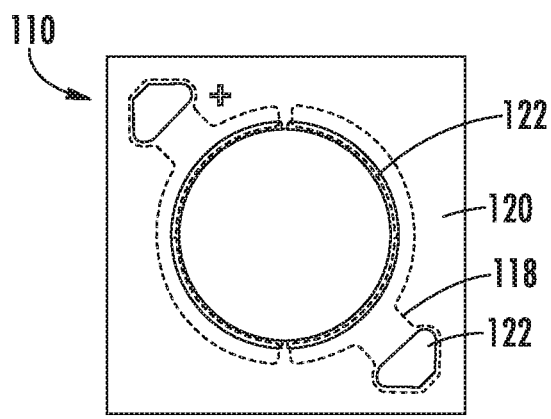
Figure 2C:
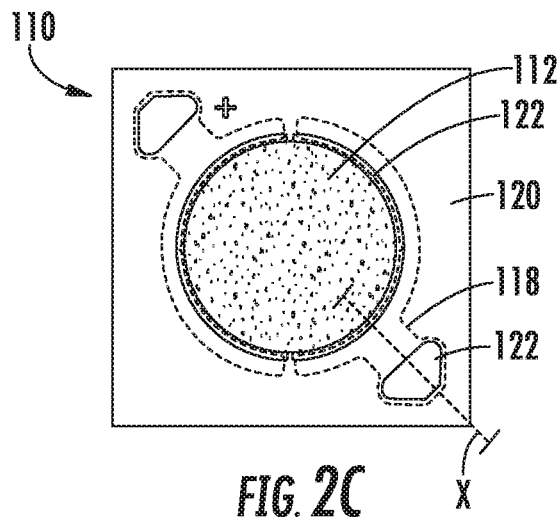

FIGS. 2A through 2B are plan views of LED component 110 depicted in FIG. 1 showing the panel construction design of an LED component with a ceramic substrate and one PCB layer. FIG. 1A shows the PCB routing, and particularly the PCB base layer 116 forming, for example only and without limitation, a substantially square body with a circular opening substantially in the center of the square body. The shape can also be any other shape or configuration, such as a rounded shape or configuration. FIG. 2B shows further layers including PCB metal layer 118 and solder mask 120. Metal plating 122 is also visible on the inner most portion of the circular opening as well as one or more contact pads. Finally, FIG. 2C illustrates the LED component 110 with all layers depicted in FIG. 1, including for example ceramic substrate 112. One corner of LED component 110 can comprise a mark, e.g. a positive (+) or negative (−) symbol, for identifying electrical characteristics for a particular side of LED component 110. For example, the positive (+) or negative (−) symbol can designate the side of the component comprising the anode or cathode.

Although not shown in FIGS. 2A through 2C, one or more light emitters such as LEDs or LED chips 114, as shown in the cross-sectional view of FIG. 1, can mount to or be disposed in the circular opening. The cross-sectional view of FIG. 1 is representative of that taken along line X of FIG. 2C, featuring each of the layers of LED component 110.

Figure 3:
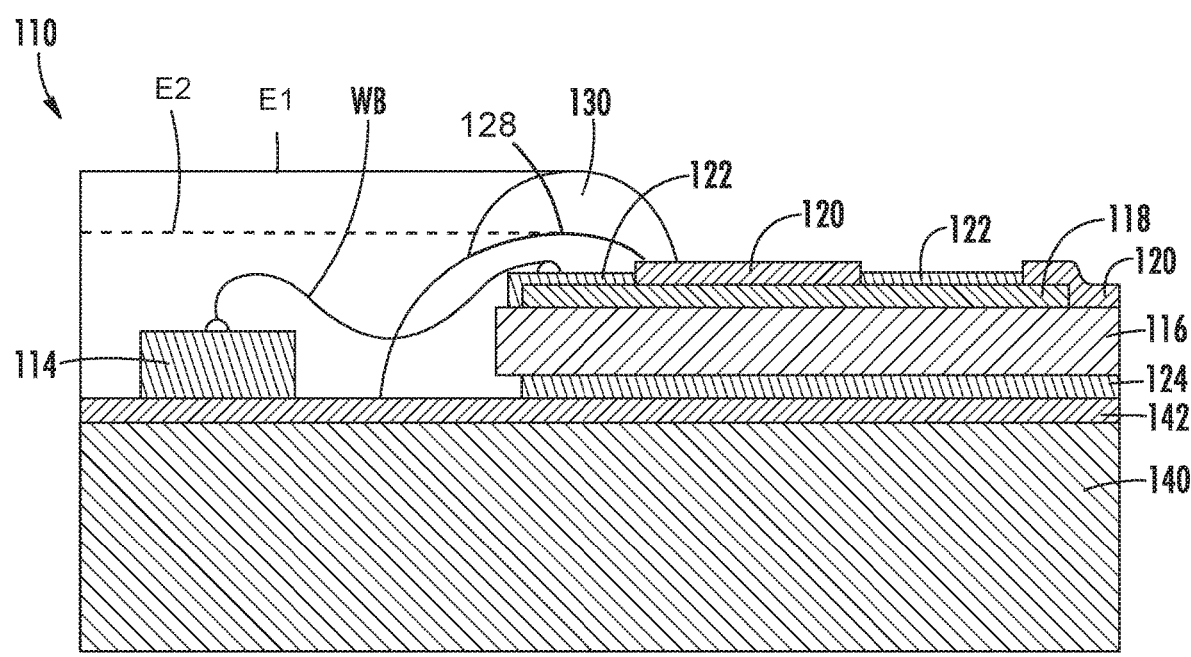
FIG. 3 is a cross-sectional side view illustrating a light emitter device component according to embodiments of the present subject matter.

FIG. 3 illustrates a cross-sectional view of a light emitter package or LED component, generally designated 110. LED component 110 as shown for example in FIG. 3 can comprise a metal substrate 140, including for example, but not limited to, aluminum, copper, etc., that can be of any suitable shape and configuration. On top of metal substrate 140 a mirror or reflective surface 142 can be provided. In some embodiments the use of a metal base mirror substrate, including metal substrate 140 and mirror 142, can provide relatively high thermal conductivity, particularly as compared to a ceramic based substrate. Thus, in some aspects a mirrored metal substrate can be best suited for high power, or high lumen per dollar/cost (LP$), applications.

Mirror or reflective surface 142 can, for example and without limitation, be positioned and disposed on substrate 140 as shown in FIG. 3. In another aspect, mirror 142 can optionally instead be positioned and/or disposed on any surface or area of substrate 140, including for example on a bottom surface of substrate 140 (i.e., a surface opposing the top surface on which one or more LED chips 114 are disposed). Mirror 140 can, for example, comprise a metal reflector (e.g., a silver layer and/or aluminum layer), a white thermal compound, or any other material known to limit loss through the bottom surface of substrate 140, thereby further improving total reflection of LED component 110.

Referring again to FIG. 3, metal substrate 140 can for example be formed without any cavity or recess so that one or more LED chips 114 are disposed on and can mount to substrate 140. As one example, substrate 140 can comprise a surface, such as an upper surface, that can but does not have to be disposed along a single plane. The one or more LED chip(s), such as LED chip 114, can be mounted directly to the surface of substrate/body 140 with only a thin adhesive layer (e.g., silicone or epoxy) between substrate 140 and LED chip 114 (i.e., without any intervening layer, such as a metal or other layer, as shown for example in FIG. 3).

LED chip 114 can be electrically connected, such as by wirebonds WB or any other suitable technique, to one or more electrical components. Wirebond WB can comprise an electrically conductive wire or conduit material. As used herein, electrical components can, for example and without limitation, comprise electrical traces, leads, electrical pads, metal plating, contact or bond pads, or any other suitable electrical component. For example, metal plating 122 can comprise a copper foil having wire-bondable gold or silver portions provided thereon. In some instances, two or more metal plates 122 can be provided and can serve as a cathode and the other as an anode for supplying LED chips 114 with current to illuminate an active layer within the LED chip. Such LED chips 114 can in some aspects be referred to as top-side contact chips or dies. Alternatively, LED chip 114 may be a flip-chip bonded to one or more electrical components, such as for example metal plating 122. Any other suitable bonding techniques could be used as well.

Regardless of the specific connection, metal plating 122 can in some embodiments be separated from substrate 140 by one or more additional layers or components. For instance, as shown in FIG. 3, an adhesive layer 124 can be applied to an upper surface of substrate 140, or upper surface of mirror 142, upon which a printed circuit board (PCB) base layer 116 can be positioned, upon which a PCB metal layer 118 can be positioned. Moreover, in some aspects a solder mask 120 can be positioned or layered on an upper surface of device 110, including on PCB metal layer 118, on PCB base layer 116, or both.

Adhesive layer 124 can be configured to adhere PCB 116 to substrate 140 and/or mirror 142. Adhesive layer 124 can comprise, for example, an organic-based adhesive, a pressure-sensitive adhesive (PSA), and/or an epoxy or silicone adhesive.

By connecting LED chip 114 and electrical components/metal plating 122 to substrate 140 using one or more intervening layers, e.g., adhesive layer 124, PCB base layer 116 and/or PCB metal layer 118, the manufacturability of LED component 110 can in some embodiments be greatly improved. Specifically, for example, prior art methods can in some aspects require resource-intensive processes in which a seed layer is deposited on the substrate by physical vapor deposition or the like, and copper is plated on the seed layer to produce electrical traces on the substrate. Other metals are typically plated on the copper to make them wire-bondable. Such methods can require a number of additional processing steps with respect to substrate 140, and these additional processing steps can leave contaminates on the ceramic surface, which can be difficult to remove and can negatively impact the performance (e.g., brightness) and reliability of the device. In contrast, using one or more intervening layers can in some aspects allow metal plating 122 to be adhered to substrate 140 in a comparatively simpler process. In such a configuration, the trace pattern can be formed separate from substrate 140 and applied using a lamination technique, such as for example a heat press and/or an overpressure chamber (i.e., autoclave) lamination technique with an adhesive film known to those having skill in the art in the multi-layer printed circuit board industry.

Printed circuit boards 116/118 can comprise a flexible printed circuit board ("flextape" PCB), such as PCB base 116, comprising a polymer-like film, that can have at least one conductive layer, such as PCB metal 118, within one or more layers of a flexible plastic resin (e.g., polyimide, Kapton from DuPont). In some aspects adhesive layer 124 can comprise a tape-like adhesive provided on the flextape for easy connection of PCB 116/118 to substrate 140 and/or mirror 142. It should be recognized, however, that PCB 116/118 can comprise any material used in multilayer PCBs or flex PCBs, including prepreg materials, reinforced laminates (e.g., glass-reinforced epoxy, materials using carbon fiber), and non-reinforced materials.

As further illustrated in FIG. 3, additional components can be integrated into LED component 110 to improve the performance and manufacturability thereof. For example, LED component 110 can further comprise an electrically insulating solder mask 120 in one or more locations, particularly on an upper surface of component 110. Solder mask 120 can be disposed on PCB 116/118, and in some embodiments at least partially on and/or adjacent to metal plating 122, such that when solder is used to attach one or more wires to an electrical solder pad (not shown), the solder will be contained within the predefined area. Choosing a white solder mask can improve the overall reflectivity of LED component 110.

LED component 110 shown in FIG. 3 can further comprise a retention material such as retention material 128 or 130 disposed at least partially about an emission area in which LED chip 114 is positioned, where retention material 128/130 can be referred to as a dam. Retention material 128/130 can for example be dispensed. After application or placement of retention material 128/130, such as for example by dispensing of retention material 128/130, an encapsulant E can be disposed within the recess formed thereby. An encapsulant such as encapsulant E1 or E2 can contain one or more phosphors such that light emitted from the one or more LED chips 114 can produce an emission of a desired wavelength. Encapsulant E1 or E2 can be selectively filled to any suitable level within the space disposed between one or more inner walls of retention material 128/130. For example, encapsulant E1/E2 can be filled to a level proximate or equal to a height of retention material 128/130 or to any level above or below the retention material. The level of encapsulant E1 or E2 can be planar or curved in any suitable manner, such as concave or convex. Retention material 128 can be dispensed first, and retention material 130 can subsequently and separately (or simultaneously) be dispensed. Retention material 128 only can be dispensed, without also having the extra height of retention material 130, wherein the height of retention material 128 then allows for the level of encapsulant to be lower (such as shown by the broken line below the top line of encapsulant E2) than what the level could be (E1) when retention material 130 is also used. By also using retention material 130, however, the increased height of retention material 130 allows for the level of encapsulant E1 to be higher and/or allows for use of possible secondary optics that can be proximate to, even with, or even above the vertical height of retention material 140.

In some aspects retention material 128/130 can be configured to have a height at least as tall as PCB 116/118, and/or at least at tall as metal plating 122, and in some aspects, as shown in FIG. 3, taller than the upper surface of metal plating 122 and/or solder mask 120. Such a configuration allows for wire bond WB, and particularly the connection of the wire bond to the metal plating, to be protected by retention material 128/130. In some aspects, retention material 128/130 can be applied in two layers to achieve the desired height, i.e. a first layer applied to fill the step up between the upper surface of substrate 140/mirror 142 and the edge of PCB 116/118, and the second applied on top of the first layer of retention material to cover wire bond WB.

Figure 4A:
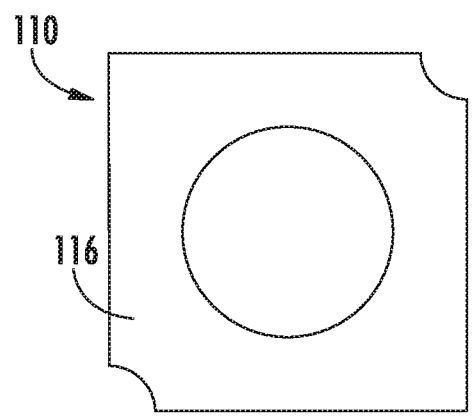
FIGS. 4A, 4B and 4C are top plan views of light emitter device components illustrating further embodiments of the present subject matter.
Figure 4B:
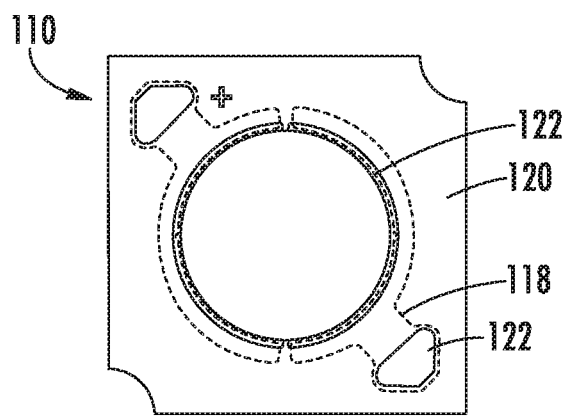
Figure 4C:
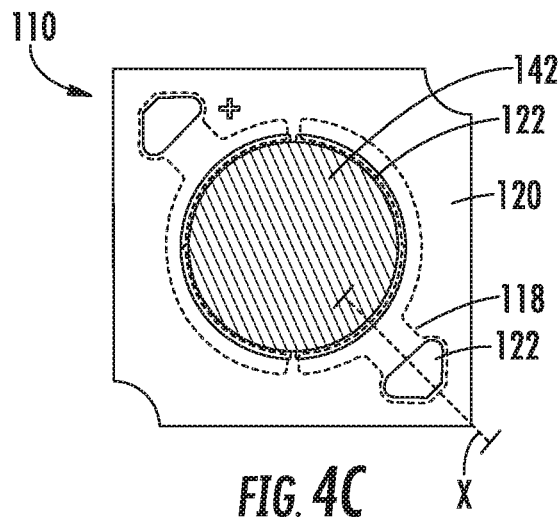

FIGS. 4A through 4C are plan views of LED component 110 depicted in FIG. 3 showing the panel construction design of an LED component with a ceramic substrate and one PCB layer. FIG. 4A shows the PCB routing, and particularly the PCB base layer 116 forming, for example only and without limitation, a substantially square body with a circular opening substantially in the center of the square body. The shape can also be any other shape or configuration, such as a rounded shape or configuration. FIG. 4B shows further layers including PCB metal layer 118 and solder mask 120. Metal plating 122 is also visible on the inner most portion of the circular opening as well as one or more contact pads. FIG. 4C illustrates LED component 110 with all layers depicted in FIG. 3, including for example metal substrate 140. One corner of LED component 110 can comprise a mark, e.g. a positive (+) or negative (−) symbol, for identifying electrical characteristics for a particular side of LED component 110. For example, the positive (+) or negative (−) symbol can designate the side of the component comprising the anode or cathode.

Although not shown in FIGS. 4A through 4C, one or more light emitters such as LEDs or LED chips 114, as shown in the cross-sectional view of FIG. 3, can mount to or be disposed in the circular opening. The cross-sectional view of FIG. 3 is representative of that taken along line X of FIG. 4C, featuring each of the layers of LED component 110.

Figure 5:
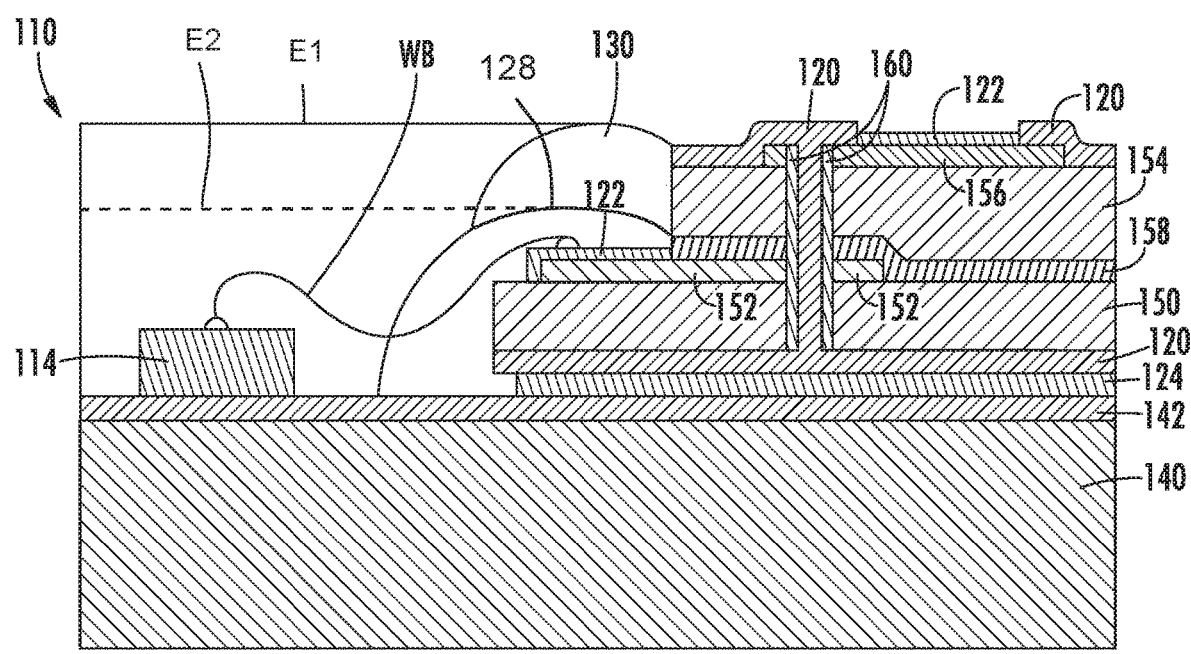
FIG. 5 is a cross-sectional side view illustrating a light emitter device component according to embodiments of the present subject matter.

FIG. 5 illustrates a cross-sectional view of a light emitter package or LED component, generally designated 110. LED component 110 depicted in FIG. 5 comprises additional material layers, additional material layers, especially as compared to those of FIGS. 1 and 3, for example, to provide a LED component with multi-layer substrate.

More particularly, by way of example and not limitation, LED component 110, as shown for example in FIG. 5, can comprise a metal substrate 140 that can be of any suitable shape and configuration. On top of metal substrate 140 a mirror or reflective surface 142 can be provided. In some embodiments the use of a metal base mirror substrate, including metal substrate 140 and mirror 142, can provide relatively high thermal conductivity, particularly as compared to a ceramic based substrate. Thus, in some aspects a mirrored metal substrate can be best suited for high power, or high lumen per dollar/cost (LP$), applications.

Mirror or reflective surface 142 can, for example and without limitation, be positioned and disposed on substrate 140 as shown in FIG. 5. In another aspect, mirror 142 can optionally instead be positioned and/or disposed on any surface or area of substrate 140, including for example on a bottom surface of substrate 140 (i.e., a surface opposing the top surface on which one or more LED chips 114 are disposed). Mirror 140 can, for example, comprise a metal reflector (e.g., a silver layer), a white thermal compound, or any other material known to limit loss through the bottom surface of substrate 140, thereby further improving total reflection of LED component 110.

Referring again to FIG. 5, metal substrate 140 can for example be formed without any cavity or recess so that one or more LED chips 114 are disposed on and can mount to substrate 140. As one example, substrate 140 can comprise a surface, such as an upper surface, that can but does not have to be disposed along a single plane. The one or more LED chip(s), such as LED chip 114, can be mounted directly to the surface of substrate/body 140 with only a thin adhesive layer (e.g., silicone or epoxy) between substrate 140 and LED chip 114 (i.e., without any intervening layer, such as a metal or other layer, as shown for example in FIG. 3).

LED chip 114 can be electrically connected, such as by wirebonds WB or any other suitable technique, to one or more electrical components. As used herein, electrical components can, for example and without limitation, comprise electrical traces, leads, electrical pads, metal plating, contact or bond pads, or any other suitable electrical component. Wirebond WB can comprise an electrically conductive wire or conduit material. For example, metal plating 122 can comprise a copper foil having wire-bondable gold or silver portions provided thereon. In some instances, two or more metal plates or plating 122 can be provided and can serve as a cathode and the other as an anode for supplying LED chips 114 with current to illuminate an active layer within the LED chip. Such LED chips 114 can in some aspects be referred to as top-side contact chips or dies. Alternatively, LED chip 114 may be a flip-chip bonded to one or more electrical components, such as for example metal plating 122. Any other suitable bonding techniques could be used as well.

Regardless of the specific connection, metal plating 122 can in some embodiments be separated from substrate 140 by one or more additional layers or components. For instance, as shown in FIG. 5, an adhesive layer 124 can be applied to an upper surface of substrate 140, or upper surface of mirror 142, upon which material layers can be applied, e.g. a plurality of printed circuit boards (PCBs), solder mask and/or prepreg layers. Adhesive layer 124 can be configured to adhere PCB 150/152, and/or solder mask 120, to substrate 140 and/or mirror 142. Adhesive layer 124 can comprise, for example, an organic-based adhesive, a pressure-sensitive adhesive (PSA), and/or an epoxy or silicone adhesive.

By connecting LED chip 114 and electrical components/metal plating 122 to substrate 140 using one or more intervening layers, e.g., adhesive layer 124, PCB base layer 150 and/or PCB metal layer 152, the manufacturability of LED component 110 can in some embodiments be greatly improved. Specifically, for example, prior art methods can in some aspects require resource-intensive processes in which a seed layer is deposited on the substrate by physical vapor deposition or the like, and copper is plated on the seed layer to produce electrical traces on the substrate. Other metals can be plated on the copper to make them wire-bondable. Such methods can require a number of additional processing steps with respect to substrate 140, and these additional processing steps can leave contaminates on the ceramic surface, which can be difficult to remove and can negatively impact the performance (e.g., brightness) and reliability of the device. In contrast, using one or more intervening layers can in some aspects allow metal plating 122 to be adhered to substrate 140 in a comparatively simpler process. In such a configuration, the trace pattern can be formed separate from substrate 140 and applied using a lamination technique, such as for example a heat press and/or an overpressure chamber (i.e., autoclave) lamination technique with an adhesive film known to those having skill in the art in the multi-layer printed circuit board industry.

In the embodiment depicted in FIG. 5, a plurality of PCB, solder mask and prepreg layers are provided, in some embodiments to form one or more, or at least two, non-coplanar layers or surfaces. For example, a first PCB base layer 150 can be positioned proximate to mirrored substrate 140/142, upon which a first PCB metal layer 152 can be positioned. In some aspects, the first PCB base layer 150 and first PCB metal layer 152 can together be referred to as the first PCB layer. A second PCB layer can be built upon the first PCB layer, the second PCB layer comprising a second PCB base layer 154 and second PCB metal layer 156, as depicted in FIG. 5. Moreover, in some aspects a solder mask 120 can be positioned or layered on an upper surface of device 110, including on second PCB metal layer 156, on second PCB base layer 154, or both. Moreover, in some aspects solder mask 120 can extend below first PCB base layer 150, in some embodiments by way of via 160. In some aspects, a prepreg 158, or prepreg layer, can be positioned between first PCB layer 150/152 and second PCB layer 154/156.

Printed circuit boards 150/154 can comprise a flexible printed circuit board ("flextape" PCB), comprising a polymer-like film, that can have at least one conductive layer, such as PCB metal 152/156, within one or more layers of a flexible plastic resin (e.g., polyimide, Kapton from DuPont). In some aspects, adhesive layer 124 can comprise a tape-like adhesive provided on the flextape for easy connection of PCB 150/152, or solder mask 120, to substrate 140 and/or mirror 142. It should be recognized, however, that PCB 150/154 can comprise any material used in multilayer PCBs or flex PCBs, including prepreg materials, reinforced laminates (e.g., glass-reinforced epoxy, materials using carbon fiber), and non-reinforced materials. In some aspects PCB 150/154, or other suitable material, can form one or more, or at least two, non-coplanar surfaces comprising an electrical component and mounted on the top surface of the metallic substrate. In some embodiments one or more of these non-coplanar surfaces can be electrically coupled to the one or more light emitter devices.

As noted above, solder mask 120 can be positioned or layered on an upper surface of device 110, including on second PCB metal layer 156, on second PCB base layer 154, or both. It can also be configured to extend, in some aspects continuously from the upper surface, below first PCB base layer 150, in some embodiments by way of via 160. Solder mask 120 can be disposed at least partially on and/or adjacent to metal plating 122, such that when solder is used to attach one or more wires to an electrical solder pad (not shown), the solder will be contained within the predefined area. Choosing a white solder mask can improve the overall reflectivity of LED component 110.

In some embodiments, via 160 can comprise a thermally conductive via disposed, or buried, within the plurality of layers of PCBs and prepregs, as depicted in FIG. 5. Such a configuration can in some aspects provide a pathway to conduct heat, such as heat produced by LED 114. In one aspect, multiple conductive thermal vias 160 can be used to dissipate the heat released from the one or more LED chips 114. Conductive thermal vias 160 can conduct heat away from LED component 110 by causing heat to flow on a path out from the one or more LED chips 114 and any intervening layers, such as PCBs 150, 152, 154 and/or 156. Conductive thermal vias 160 can comprise any thermally conductive material known in the art, for example silver metal, which can assist in minimizing junction temperature difference between the LED chip(s) and an external sink or surface, thus prolonging the life of LED component 110.

In FIG. 5, LED component 110 can further comprise a retention material such as retention material 128 or 130 disposed at least partially about an emission area in which LED chip 114 is positioned, where retention material 128/130 can be referred to as a dam. Retention material 128/130 can for example be dispensed. After application or placement of retention material 128/130, such as for example by dispensing of retention material 128/130, an encapsulant E1/E2 can be disposed within the recess formed thereby. An encapsulant such as encapsulant E1 or E2 can contain one or more phosphors such that light emitted from the one or more LED chips 114 can produce an emission of a desired wavelength. Encapsulant E1 or E2 can be selectively filled to any suitable level within the space disposed between one or more inner walls of retention material 128/130. For example, encapsulant E1/E2 can be filled to a level proximate or equal to a height of retention material 128/130 or to any level above or below the retention material. The level of encapsulant E1 or E2 can be planar or curved in any suitable manner, such as concave or convex. Retention material 128 can be dispensed first, and retention material 130 can subsequently and separately (or simultaneously) be dispensed. Retention material 128 only can be dispensed, without also having the extra height of retention material 130, wherein the height of retention material 128 then allows for the level of encapsulant to be lower (such as shown by the broken line below the top line of encapsulant E2) than what the level could be (E1) when retention material 130 is also used. By also using retention material 130, however, the increased height of retention material 130 allows for the level of encapsulant E1 to be higher and/or allows for use of possible secondary optics that can be proximate to, even with, or even above the vertical height of retention material 140.

In some aspects therefore, retention material 128/130 can be configured to have a height at least as tall as the plurality of layers of PCBs, prepregs and solder masks, as depicted in FIG. 5. More particularly, dam or retention material 128/130 can be configured to be at least as tall as metal plating 122, and in some aspects, as shown in FIG. 5, taller than the upper surface of metal plating 122 and/or solder mask 120, all of which is on top of first and second PCBs. Such a configuration allows for wire bond WB, and particularly the connection of the wire bond to the metal plating, to be protected by retention material 130.

In some embodiments a first PCB layer 150/152 can provide an inner ledge extending more inward toward LED chip 114 as compared to second PCB layer 154/156, and at a lower height. Stated another way, when viewed from the top down, e.g. as in FIGS. 6A-6C, the center cutout for first PCB layer 150 is smaller than the center cutout for second PCB layer 154. This stepped configuration provided by the multi-layered arrangement provides an inner ledge upon which metal plating 122, or electrical contact, can be applied. Metal plating 122 on this PCB layer 150 ledge provides a location for wire bonding WB that is recessed and protected from inadvertent contact from an outside force, thereby making LED component 110 more robust. Because the wired bonding WB is both recessed below the height of the second PCB layer 154 and covered with retention material 128/130, it is less likely to be impacted and damaged by outside forces.

In some aspects, retention material 130 can be applied in two layers to achieve the desired height, i.e. a first layer (such as retention material 128) applied to fill the step up between the upper surface of substrate 140/mirror 142 and the edge of first PCB 150/152, and the second layer applied on top of the first layer of retention material 128/130 to cover wire bond WB. Whether applied in one, two, or more layers, retention material 128/130 can be configured to cover the recessed ledge between first PCB layer 150 and second PCB layer 154, and protect wire bond WB.

In some embodiments, the height of second PCB layer 154 can be configured at any desirable height, or thickness, to achieve the desired depth of the step between first and second PCB layers. The depth of the retention material 128/130 can be configured to correspond to this depth/height so as to extend at least level with, or in some aspects above, the plurality of layers, including for example an upper surface of solder mask 120. In some aspects the depth of retention material 128/130 can correspond to the overall height of the multiple layers of PCBs, prepregs and solder masks, which can be adjusted as desired based the number of layers and/or relative thickness of each.

In some aspects, and still referring for example to FIG. 5, a LED component such as LED component 110 can comprise a substrate, such as substrate 140, and one or more light emitter devices, such as LEDs or LED chips 114, mounted or disposed on the substrate, where the LED component includes a plurality of non-coplanar surfaces and where the substrate can be metallic or non-metallic, and where the substrate does or does not include a mirrored surface. In this configuration or embodiment, at least one or more of the one or more light emitter devices can be wirebonded to a first electrical component, such as at metal plating 122 of a first PCB layer, such as a first PCB layer 150/152, and where metal plating 122 is non-coplanar with the substrate and/or the top surface of the one or more light emitter devices on the substrate. A seconded electrical component of the LED component, such as metal plating of second PCB layer 154/156, can be non-coplanar with the first electrical component and also non-coplanar with the substrate and the top surface of the one or more light emitter devices on the substrate. The second electrical component can be electrically connected to the first electrical component. While not necessary, a retention material can cover or contact at least a portion of the first electrical component. The second electrical component can comprise an external contact for electrical connection to the LED component.

Figure 6A:
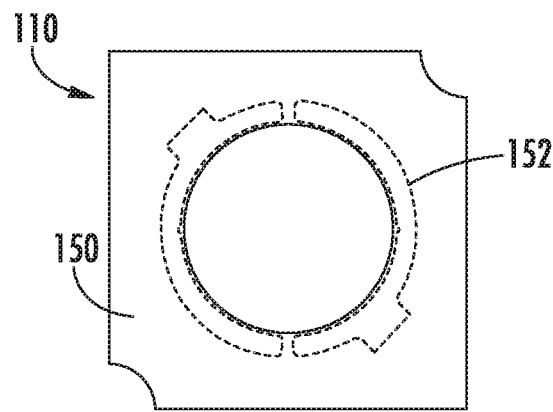
FIGS. 6A, 6B and 6C are top plan views of light emitter device components illustrating further embodiments of the present subject matter.
Figure 6B:
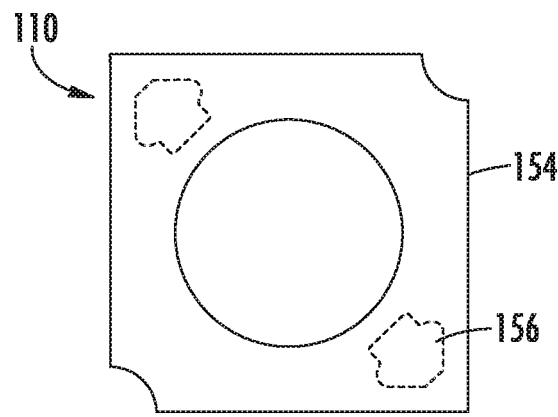
Figure 6C:
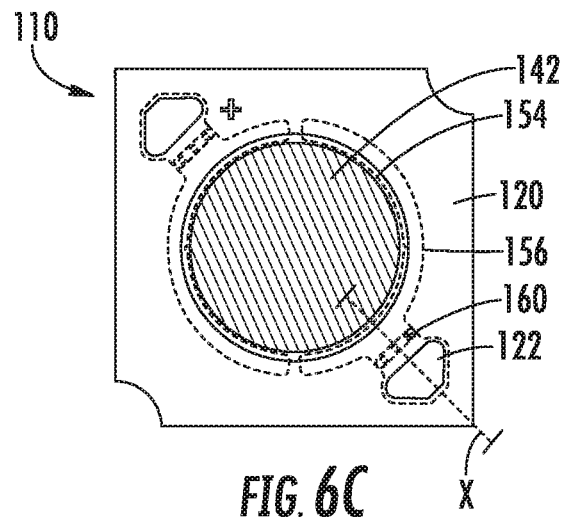

FIGS. 6A through 6C are plan views of LED component 110 depicted in FIG. 5 showing the panel construction design of an LED component with a ceramic substrate and one PCB layer. FIG. 6A shows the PCB routing, and particularly the PCB base layer 150 forming, for example only and without limitation, a substantially square body with a circular opening substantially in the center of the square body. The shape can also be any other shape or configuration, such as a rounded shape or configuration. FIG. 6B shows further layers including PCB metal layer 156 and −PCB layer 154. Finally, FIG. 6C illustrates the LED component 110 with all layers depicted in FIG. 5, including for example mirror 142 and vias 160. One corner of LED component 110 can comprise a mark, e.g. a positive (+) or negative (−) symbol, for identifying electrical characteristics for a particular side of LED component 110. For example, the positive (+) or negative (−) symbol can designate the side of the component comprising the anode or cathode.

Although not shown in FIGS. 6A through 6C, one or more light emitters such as LEDs or LED chips 114, as shown in the cross-sectional view of FIG. 5 can mount to or be disposed in the circular opening. The cross-sectional view of FIG. 5 is representative of that taken along line X of FIG. 6C, featuring each of the layers of LED component 110.

FIGS. 7A and 7B provide data demonstrating, for example and without limitation, improved thermal properties of the disclosed LED components and devices. This data is for the LED components and devices as disclosed for example herein. Different features for the LED components and devices can mean that data such as in FIG. 7A and beyond are different. FIG. 7A is a tabular compilation of performance data for an exemplary LED component (CXB1512) configured in accordance with the instant disclosure. FIG. 7B is a plot comparing an exemplary LED component (CXB1512) with Al versus HRA (aluminum mirror versus high reflectivity alumina) and the effects on Delta T versus heat sink over increasing currents (mA). The aluminum mirror and high reflectivity alumina substrates were used as exemplary materials for purposes of collecting the data presented herein. In FIGS. 7A and 7B, data in the plot and columns 4 and 5 of the table is the temperature of the LES (light emitting surface) as measured by an IR camera with a given heat sink temp (column 2) at a given current (column 3). Column 6 is the difference between 4 (ceramic) and 5 (metal). The plot is showing relative temperature change with current: at 0 current, delta TLES is 0 or with current applied add the value from the curve to the heat sink temperature. FIGS. 7C and 7D demonstrate the improved optical properties of the disclosed LED components and devices. FIG. 7C shows the lumen output over increasing power (W) for an exemplary LED component (CXB1512) with a mirrored substrate versus a ceramic substrate. FIG. 7D shows the lumen per watt (LPW) over increasing power (W) for an exemplary LED component (CXB1512) with a mirrored substrate versus a ceramic substrate. FIGS. 7C and 7D show the lumen and LPW performance difference for the two products outlined in FIGS. 7A and 7B. Particularly, ceramic starts with better lumen/LPW performance at lower power, but has quicker droop with increased current due to the thermal properties. As a result, the curve for ceramic crosses under the metal curve. At least one conclusion is that ceramic is better for lower power and high LPW applications, but metal is better for high power and high lumen per dollar applications.

Embodiments of the present disclosure shown in the drawings and described above are exemplary of numerous embodiments that can be made within the scope of the appended claims. It is contemplated that the configurations of LED components such as those disclosed herein can comprise numerous configurations other than those specifically disclosed.

What is claimed is:

1. A light emitter device component comprising:
    a metallic substrate having a top surface;
    a mirrored surface on at least a portion of the top surface of the metallic substrate;
    one or more light emitter devices mounted on the top surface of the metallic substrate or the mirrored surface;
    at least two non-metallic layers mounted on the metallic substrate and positioned adjacent to the one or more light emitter devices in a same horizontal plane, wherein a height of the at least two non-metallic layers extending vertically above the metallic substrate is greater than a height of the one or more light emitter devices mounted to the top surface of the metallic substrate; and
    one or more electrical components mounted on the at least two non-metallic layers and electrically coupled to the one or more light emitter devices by one or more wire bonds directly connected between the one or more electrical components and the one or more light emitter devices, wherein the one or more wire bonds are at least partially protected by a retention material covering the one or more wire bonds at an attachment point on the one or more electrical components, wherein the one or more electrical components are spaced from the metallic substrate by the at least two non-metallic layers, wherein the retention material is adjacent to an encapsulant covering the one or more light emitter devices, wherein the retention material is a separate structure from the encapsulant;
    wherein the encapsulant directly contacts the retention material and the mirrored surface or the top surface of the metallic substrate; and
    wherein the retention material directly contacts the attachment point and the mirrored surface or the top surface of the metallic substrate.

2. The light emitter device component according to claim 1, wherein the at least two non-metallic layers comprise a plurality of dielectric layers.

3. The light emitter device component according to claim 2, wherein the plurality of dielectric layers comprise a polyimide-based polymer.

4. The light emitter device component according to claim 2, wherein the plurality of dielectric layers each comprise a printed circuit board (PCB).

5. The light emitter device component according to claim 4, wherein each printed circuit board comprises FR-4, CEM-3, CEM-4, or a related composite material.

6. The light emitter device component according to claim 4, wherein the PCBs are layered one on top another.

7. The light emitter device component according to claim 6, further comprising a prepreg layer between the two PCB layers.

8. The light emitter device component according to claim 1, wherein the one or more light emitter devices comprise light emitting diode (LED) chips.

9. The light emitter device component according to claim 1, wherein the one or more light emitter devices is mounted directly on the top surface of the metallic substrate or directly on the mirrored surface without any intervening layer other than a thin adhesive layer.

10. The light emitter device component according to claim 1, further comprising a solder mask on an upper surface of the at least two non-metallic layers.

11. The light emitter device component according to claim 1, wherein the at least two non-metallic layers increase thermal conductivity of the light emitter device component as compared to a device with a non-metallic substrate without a plurality of non-metallic layers.

12. The light emitter device component according to claim 1, further comprising another retention material in contact with the at least two non-metallic layers, wherein the another retention material forms a dam surrounding the one or more light emitter devices, wherein the another retention material is a separate structure from the encapsulant.

13. The light emitter device component according to claim 12, wherein a height of the another retention material is at least as high as the at least two non-metallic layers, and higher than the one or more light emitter devices.

14. The light emitter device component according to claim 12, wherein the another retention material covers a wire bond electrically coupling the one or more light emitter devices to the one or more electrical components.

15. The light emitter device component according to claim 12, wherein the another retention material is applied in at least two layers, one on top of another.

16. The light emitter device component according to claim 12, wherein the encapsulant covering the one or more light emitter devices is contained within the dam formed by the another retention material.

17. The light emitter device component according to claim 1, further comprising a via transecting the at least two non-metallic layers.

18. The light emitter device component according to claim 17, wherein a solder mask is provided on an upper surface of the at least two non-metallic layers, and on a lower surface of the one or more non-metallic layers, wherein the solder mask on the upper and lower surfaces are connected by the via.

19. The light emitter device component according to claim 1, wherein the at least two non-metallic layers form a stepped configuration with a recessed ledge between a first and a second non-metallic layer of the at least two non-metallic layers, wherein the first and second non-metallic layers forming a recessed ledge are adjacent to the one or more light emitter devices, wherein one of the one or more electrical components and one of the one or more wire bonds directly connected thereto is located at the recessed ledge, wherein the retention material at least partially covers the one or more wire bonds connected to the one or more electrical components located at the recessed ledge.

20. The light emitter device component according to claim 1, wherein the encapsulant comprises at least two layers of encapsulant, wherein the retention material comprises as least two retention materials.

21. A light emitter device component comprising:
a metallic substrate having a top surface;
a mirrored surface on at least a portion of the top surface of the metallic substrate;
one or more light emitter devices mounted on the top surface of the metallic substrate or the mirrored surface;
at least two non-coplanar non-metallic surfaces comprising an electrical component and mounted on the top surface of the metallic substrate, wherein each of the at least two non-coplanar non-metallic surfaces are horizontally adjacent to the one or more light emitter devices, wherein the electrical component is spaced apart from the metallic substrate, wherein the electrical component of at least one of the at least two non-coplanar non-metallic surfaces is electrically coupled to the one or more light emitter devices by a wire bond directly connected between the electrical component and the one or more light emitter devices, wherein a combined height of the at least two non-coplanar non-metallic layers mounted on the metallic substrate is greater than a height of the one or more light emitter devices mounted to the top surface of the metallic substrate; and a retention material in contact with at least one of the at least two non-coplanar non-metallic surfaces, wherein the retention material forms a dam surrounding the one or more light emitter devices, wherein the retention material at least partially covers the wire bond at an attachment point on the one or more electrical components, wherein the retention material is adjacent to an encapsulant covering the one or more light emitter devices and contained within the dam formed by the retention material, wherein the retention material is a separate structure from the encapsulant;
wherein the encapsulant directly contacts the retention material and the mirrored surface or the top surface of the metallic substrate; and
wherein the retention material directly contacts the attachment point and the mirrored surface or the top surface of the metallic substrate.

22. The light emitter device of claim 21, wherein the at least two non-coplanar non-metallic surfaces comprise one or more printed circuit boards (PCBs) layered one on top of another.

23. The light emitter device component according to claim 21, wherein the at least two non-coplanar non-metallic layers form a stepped configuration with a recessed ledge between a first and a second non-metallic layer of the at least two non-coplanar non-metallic layers, wherein the first and second non-metallic layers forming a recessed ledge are adjacent to the one or more light emitter devices, wherein the electrical component and the wire bond connected between the electrical component and one of the one or more light emitter devices is located at the recessed ledge.

24. The light emitter device component according to claim 21, wherein the encapsulant comprises at least two layers of encapsulant, wherein the retention material comprises as least two retention materials.

25. A method of forming a light emitter device component having improved thermal properties, the method comprising:
mounting one or more light emitter devices on a top surface of a substrate, the substrate comprising a metallic base with a mirrored upper surface;
disposing a plurality of non-metallic layers on the top surface of the substrate and surrounding the one or more light emitter devices, wherein the plurality of non-metallic layers are positioned adjacent to the one or more light emitter devices in a same horizontal plane, wherein a combined height of the plurality of non-metallic layers extending vertically above the metallic substrate is greater than a height of the one or more light emitter devices mounted to the top surface of the substrate; and
mounting one or more electrical components to at least one of the plurality of non-metallic layers and electrically coupling them to the one or more light emitter devices by one or more wire bonds directly connected between the one or more electrical components and the one or more light emitter devices, wherein the one or more wire bonds are at least partially protected by a retention material covering the one or more wire bonds at an attachment point on the one or more electrical components, wherein the one or more electrical components are spaced from the substrate body by the plurality of non-metallic layers, wherein the retention material is adjacent to an encapsulant covering the one or more light emitter devices, wherein the retention material is a separate structure from the encapsulant;

wherein the encapsulant directly contacts the retention material and the mirrored upper surface of the substrate; and wherein the retention material directly contacts the attachment point and the mirrored upper surface of the substrate.

26. The method of forming a light emitter device component according to claim 25, wherein the plurality of non-metallic layers comprise a plurality of dielectric layers, and wherein the plurality of dielectric layers each comprise a printed circuit board (PCB).

27. The method of forming a light emitter device component according to claim 26, wherein the PCBs are layered one on top of another.

28. The method of forming a light emitter device component according to claim 27, further comprising applying a prepreg layer between the two PCBs.

29. The method of forming a light emitter device component according to claim 25, wherein the one or more light emitter devices comprise light emitting diode (LED) chips.

30. The method of forming a light emitter device component according to claim 25, wherein the plurality of non-metallic layers form a stepped configuration with a recessed ledge between a first and a second non-metallic layer, wherein at least one of the one or more electrical components and one of the one or more wire bonds are located at the recessed ledge.

31. The method of forming a light emitter device component according to claim 25, wherein a height of the retention material is at least as high as the plurality of non-metallic layers, and higher than the one or more light emitter devices.

* * * * *